(12) United States Patent
Carcia (10) Patent No.: US 6,274,280 B1
(45) Date of Patent: Aug. 14, 2001

(54) MULTILAYER ATTENUATING PHASE-SHIFT MASKS

(75) Inventor: Peter Francis Carcia, Wilmington, DE (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 09/459,777

(22) Filed: Dec. 13, 1999

Related U.S. Application Data (60) Provisional application No. 60/115,906, filed on Jan. 14, 1999.

(51) Int. Cl.$^7$ .................................................. G03F 9/00
(52) U.S. Cl. ................................................................ 430/5
(58) Field of Search ........................ 430/5, 322; 428/433

(56) References Cited

U.S. PATENT DOCUMENTS 5,897,977  4/1999  Carcia et al. .............................. 430/5

OTHER PUBLICATIONS

Marc D. Levenson, "Wavefront engineering for photolithography", *Physics Today*, 28, Jul. 1993.

Y.C. Ku et al., "Use of pi–phase shifting x–ray mask to increase intensity slope at feature edges", *J. Vac. Sci. Technol.*, B6(1), 150, 1988.

K. K. Shih et al., "Thin film materials for the preparation of attenuating phase shift masks", *J. Vac. Sci. Technol.*, B12(1), 32, 1994.

A. Scherer et al., "High reflectivity dielectric mirror deposition by reactive magnetron sputtering", *J. Vac. Sci. Technol.*, A10(5), 3305, 1992.

D. J. Stephens et al., "Effects on thin film deposition rates, and process–induced interfacial layers on the optical properties of phasma–deposited $SiO_2/Si_3N_4$ Bragg reflectors", *J. Vac. Sci. Technol.*, A11(4), 893, (1993).

M. Ohring, *The Materials Science of Thin Films,* Academic Press, San Diego 1992, 11, 534–536.

T. M. Bloomstein et al., "Lithography with 157 nm lasers", *J. Vac. Sci. Technol.*, B15(6), 2112, 1997.

T. M. Bloomstein et al., "Critical issues in 157 nm litography", *J. Vac. Sci. Technol.*, B16(6), 3154, 1998.

*Primary Examiner*—S. Rosasco (57) ABSTRACT

Disclosed are attenuating embedded phase shift masks capable of producing a phase shift of 180° with an optical transitivity of at least 0.001 at a selected lithographic wavelength less than 200 nm. The masks are comprised of distinct contiguous alternating contiguous layers of an optically transparent material consisting essentially of an oxide selected from the group consisting of oxides of Al and Si and layers. of an optically absorbing material consisting essentially of a nitride selected from the group consisting of nitrides of Al and Si. Such masks are commonly known in the art as attenuating (embedded) phase shift masks or half-tone phase shift masks.

3 Claims, 8 Drawing Sheets

f(SiN)

Figure 8 f(AlN)

MULTILAYER ATTENUATING PHASE-SHIFT MASKS

This application claims benefit of Provisional Application 60/115,906 filed Jan. 14, 1999.

FIELD OF THE INVENTION

This invention relates to phase shift masks, specifically photomask blanks and the patterned photomasks made therefrom, in optical lithography with short wavelength, i.e., <200 nm, light. More specifically this invention relates to phase shift masks that attenuate and change the phase of transmitted light by 180° relative to light propagating the same path length in air. Such masks are commonly known in the art as attenuating (embedded) phase shift masks or half-tone phase shift masks. Still more particularly, this invention discloses novel attenuating embedded phase-shift masks, whose optical properties can be engineered at any wavelength by multilayering ultrathin UV transparent layers with ultrathin UV absorbing layers.

BACKGROUND OF THE INVENTION

Optical lithography is one of the key enabling technologies in semiconductor microcircuit fabrication. Photomasks, which are high purity quartz or glass plates containing precision microscopic images of intergrated circuits, are used to transfer precise design patterns on to silicon wafers. Deposition and etching techniques create actual circuits on the wafers, which are then cut into hundreds of individual chips. Making a complex chip, such as a microprocessor, can involve more than 20 layers. And each requires a different, precise, reusable mask.

As the demand for devices with higher performance and speed continue, the need for patterning circuits with finer features is driving optical micro-lithography to shorter and shorter wavelengths (248 nm→193 nm→157 nm). This is because the resolution achieved with traditional Cr masks, that either block or pass light for imaging, is limited by optical diffraction effects. At any wavelength, however, phase-shift masks can extend resolution beyond the wavelength-imposed diffraction limit Phase-shift masks work by employing destructive optical interference to enhance contrast. Current projections are that optical lithography with 193 nm light and phase-shift masks will support designs with minimum feature size of 120 nm. But sub 100 nm features will require moving to 157 nm and phase-shifting, if optical lithography is to be used.

Phase-shift masks for optical lithography, and attenuating phase-shift masks in particular, have been the subject of numerous publications, e.g., Marc D. Levenson, "Wavefront engineering for photolithography," Physics Today, 28, Jul. 1993, and Y.-C. Ku, E. H. Anderson, M. Schattenburg, and H. I. Smith, "Use of pi-phase shifting x-ray mask to increase intensity slope at feature edges," J. Vac. Sci. Technol. B6(1) 150 (1988). Nearly all of the prior art of attenuating phase-shift masks falls into two categories: (1) nonstoichiometric materials, that is, materials that are chemically deficient in one or more elements to be considered proper compounds and (2) bi-layers comprised of one absorber and one phase-shift layer. Commonly assigned, copending application Ser. No. 08/797,443, filed Feb. 10, 1997, now U.S. Pat. No. 5,897, 977 discloses optical multilayer structures as a novel approach to systematically designing attenuating phase-shift masks. They consist of alternating, ultrathin (<10 nm) layers of an optically transparent material , multilayered with an optically absorbing material at the optical wavelength of use. Both the optically transparent and absorbing layers can be stable compounds. Non-stoichiometric materials, such as $SiN_x$, K. K. Shih and D. B. Dove, "Thin film materials for the preparation of attenuating phase shift masks," J. Vac. Sci. Technol. B 12(1) 32 (1994), are less attractive because their optical properties depend critically on synthesis conditions, so that, for example, a small fluctuation in the partial pressure of the reactive gas concentration during sputtering can cause large excursions in optical properties such as transmission as well as phase-shift. Non-stoichiometric materials also tend to be less stable, especially thermally, than the corresponding stoichiometric compound.

Bilayer designs usually consist of a thin metal such as Cr, which is optically absorbing and a transparent layer such as SiO2. The disadvantages of this structure include the need to interrupt the manufacturing process, because each layer requires very different synthesis conditions. In fact, transfer of the partially made mask blank to a separate deposition chamber may be required Mask-making is also made difficult by the requirement for distinctly different etch processes for each layer and also by potential problems such as delaminating of the separate layers that can occur because of significant differences in their thermal, mechanical, and chemical properties.

In contrast, control of optical properties of optical multilayers is by layer thickness, which can be precisely controlled in the sputtering process, usually preferred for manufacturing. Also the layers are kept ultra-thin, compared to the optical lithographic wavelength—thus optical properties are less sensitive to interfacial roughness and this promotes uniform etching of the separate layers. Also, both layers of the multilayer can be chosen to be stable nitride or oxide compounds. Thus, systematic tailoring of optical properties (i.e., chemistry) is by layer thickness; and this approach is tunable for multiple optical wavelengths. Further, sputtering conditions can be chosen with broad process latitude with the simplicity of elemental sputtering targets. Chemically stable layers can be selected with attractive etch properties. And the layers can be thin, leading to uniform dry etching and improved radiation stability.

While there are disclosures in the literature to $SiO_2/Si_3N_4$ multilayers for application as "dielectric mirrors " or equivalently as "Bragg reflectors", e.g., A. Scherer, M. Walther, L. M. Schiavone, B. P. Vander Gaag, and E. D. Beebe, "Thigh reflectivity dielectric mirror deposition by reactive magnetron sputtering," J. Vac. Sci. Technol. A 10(5) 3305 (1992) and D. J. Stephens, S. S. He, G. Lucovsky, H. Mikkelsen, K. Leo, and H. Kurz, "Effects of thin film deposition rates, and process-induced interfacial layers on the optical properties of plasma-deposited $SiO_2/Si_3N_4$ Bragg reflectors, J. Vac. Sci. Technol. A 11(4) 893 (1993), their structure and properties at the operating wavelength are very different than what is required for phase-shift masks at wavelengths below 200 nm. The application of multilayered stacks as dielectric mirrors is disclosed in "The Materials Science of Thin Films", M. Ohring, Academic Press, San Diego 1992 in Chapter 11, pp. 534–536. One requirement is that one material in the stack have a high index of refraction relative to the other material. And each layer in the stack must be a quarter wavelength thick at the reflector or operating wavelength. It is also desirable that both layers be transparent, i.e., have negligible extinction coefficient, at the reflector wavelength for maximum reflectivity. By comparison application as a phase-shift mask does not require that separate layers have contrast in their indices of refraction, although they may. However, one layer should be absorbing for application as a tenuating phase-shift masks, so that the optical transmission of the stack can be adjusted by the thickness ratio of the two layers. Further, there is no restriction of layer thickness for phase-shift masks as there is for a dielectric mirror, where each layer must have a thickness corresponding to a quarter wavelength. In fact layer thicknesses much less than the operating wavelength are preferred in application as phase-shift masks. The optical design for a dielectric mirror is unrelated to the design criteria for an attenuating, phase-shift mask, and these design equations are distinctly different Thus, there is no way to anticipate whether a particular multilayer stack can be designed to be an attractive attenuating, phase-shift mask, solely based on its satisfactory performance as a dielectric mirror.

Commonly assigned, copending application Ser. No. 08/797,443, filed Feb. 10, 1997, now U.S. Pat. No. 5,897,977, granted Apr. 27, 1999, discloses a novel, systematic materials approach involving optical multilayer structures to design attenuating phase-shift masks, the most versatile and common type phase-shift mask, applicable at any optical wavelength, with particular emphasis on wavelengths below 400 nm. These multilayers are comprised of alternating, ultrathin (<10 nm) layers of an optically transparent material, multilayered with an optically absorbing one, e.g., $Si_3N_4$ and TiN, respectively. While the multilayered structures of this disclosure fill a wide variety of applications, the need remains for simpler multilayered system which are more easily manufactured.

This invention provides for two particularly simple optical multilayer masks, specifically, silicon oxide multilayered with silicon nitride and aluminum oxide layered with aluminum nitride. The masks provided for by this invention have attractive properties as phase-shift masks with application at wavelengths below 200 nm, and in particular near 157 nm, as discussed in T. M. Bloomstein, M. W. Horn, M. Rothschild, R. R. Kunz, S. T. Palmacci, and R. B. Goodman, "Lithography with 157 nm lasers," J. Vac. Sci. Technol. B15(6) 2112, 1997 and T. M. Bloomstein, M. Rothschild, R. R. Kunz, D. E. Hardy, R. B. Goodman, and S. T. Palmacci, "Critical issues in 157 nm lithography, J. Vac. Sci. Technol. B16(6) 3154, 1998 [1,2], targeted for optical lithography following the 193 nm generation.

SUMMARY OF THE INVENTION

This invention provides for an attenuating embedded phase shift mask capable of producing a phase shift of 180° with an optical transmissivity of at least 0.001 at a selected lithographic wavelength <200 nm, said mask comprising distinct alternating contiguous layers of an optically transparent material consisting essentially of an oxide selected from the group consisting of oxides of Al and Si and layers of an optically absorbing material consisting essentially of a nitride selected from the group consisting of nitrides of Al and Si. It is preferred for ease of manufacture that the distinct layers contain the same cation, i.e., either an oxide of silicon on a nitride of silicon or an oxide of aluminum on a nitride of aluminum.

As used hereinunder the term "mask" is intended to include both photomask blanks, i.e., unpatterned photomasks prior to imagewise exposure to imaging radiation, and patterned photomasks, i.e., photomasks containing an imagewise pattern resulting from imagewise exposure to imaging radiation.

DETAILED DESCRIPTION OF THE INVENTION

This invention relates to attenuating phase-shift masks based on novel Si-based and Al-based optical multilayer structures for optical lithography at wavelengths below 200 nm. Preferably, the phase-shift masks are comprised of either Si-nitride layered with Si-oxide or Al-oxide layered with Al-nitride. At wavelengths below about 200 nm Si-oxide is more transparent than Si-nitride, and Al-oxide is more transparent than Al-nitride. At about 157 nm, which is a candidate wavelength for the next generation optical lithography, Al-oxide and Si-oxide films of thicknesses less than 200 nm have negligible optical absorption for application as photomasks. At this same wavelength Al-nitride and Si-nitride are optically absorbing with extinction coefficients close to but less than one (1.0), providing a gradual dependence of multilayer optical properties on the oxide to nitride thickness ratio. Precise tailoring of optical properties and phase-shift of the corresponding multilayer structures can be achieved by layering Al-nitride with Al-oxide or layering Si-nitride with Si-oxide.

Because each layer in the structure consists of either Si or Al, synthesis is greatly simplified and can be accomplished by techniques well known in the art. In the case of sputtering, only one target, either Si or Al, is needed. Sputtering, because of its excellent control and reproducibility, is usually preferred for manufacture of lithographic masks. For sputtering, the transition from oxide to nitride layer, or vice versa, is accomplished by changing the reactive gas from oxygen to nitrogen. For example, multilayers of Si-oxide/Si-nitride can be made by ion-beam sputtering, using one ion gun to sputter Si atoms from the Si target and a secondary ion gun to alternately bombard the substrate with oxygen and then nitrogen ions to form alternating layers of Si-oxide and Si-nitide. Of course, alternating layers of oxide and nitride can also be made by chemical vapor deposition, using appropriate individual precursor chemicals for each layer, as well known to those skilled in the art of chemical vapor deposition. For example, Si-nitride layers can be synthesized from silane plus ammonia ($SiH_4$+ $NH_3$), while Si-oxide layers can be grown from hexamethyldisiloxane ($C_6H_{18}Si_2O$).

The art of preparing patterned photomasks from unpatterned photomasks, known as photomask blanks, is well know and the various techniques for so doing are completely described in L. F. Thompson et al., "Introduction to Microlithography", Second Edition, ACS Professional Reference Book, American Chemical Society, Washington, D.C., 1994. Typically, to pattern photomask blanks made of Si-oxide/Si-nitride or Al-oxide/Al-nitride multilayers of this invention dry etching is preferred. For both Al-based and Si-based multilayers, because of the similar layer chemistries, e.g. Si-oxide and Si-nitride, the same dry etch protocol can be used for both layers, effectively etching the multilayer as a chemically homogeneous material. For example, $CF_4$ can be used to dry etch Si-oxide and Si nitride layers.

From a knowledge of the index of refraction and extinction coefficients for the oxide and nitrides of Si and Al, one can calculate the thicknesses of individual oxide and nitride layers in a multilayer structure with 180 degrees phase-shift and a particular optical transmission at a specified wavelength. The equations relating phase-shift, optical transmission ($T_s$) for a multilayer film with optical coefficients, $n_s$ and $k_s$ and total thickness $d_s$ at an optical wavelength $\lambda$ are:

$$(n_s-1)d_s \approx \lambda/2$$

$$T_s \approx (1-R)^2 \exp(-4\pi k_s d_s/\lambda)$$

(K. K. Shih and D. B. Dove J. Vac. Sci. Technol. B 12(1), Jan/Feb 1994, pp. 32–38).

Here, R is the reflection coefficient for the multilayer film. R can calculated from $n_s$ and $k_s$ (O. S. Heavens, Optical Properties of Thin Solid Films, Dover, New York, 1991, Chapter 4, pp 46–95).

The optical coefficients for the multilayer can be calculated from the coefficients for individual oxide and nitride layers (a and b) using the effective medium approximation, when the oxide and nitride layers are thin compared with optical wavelength, that is, $d_a$, $d_b$<<$1/10\lambda$. Hunderi and K. Johannessen, Superlattices and Microstructures, Vol. 3, No. 2, 1987, pp. 193–198):

$$e_s = fe_a + (1-f)e_b; \text{ f=fraction of metal} \quad (3)$$

where the dielectric coefficients e are related to the corresponding optical coefficients by $$e = (n-ik)^2 \quad (4)$$

In the above expression, f corresponds to the fractional thickness of the absorbing nitride layer in the multilayer structure, and thus (1−f) corresponds to the factional thickness of the more optically transparent oxide layer.

Figure 1:
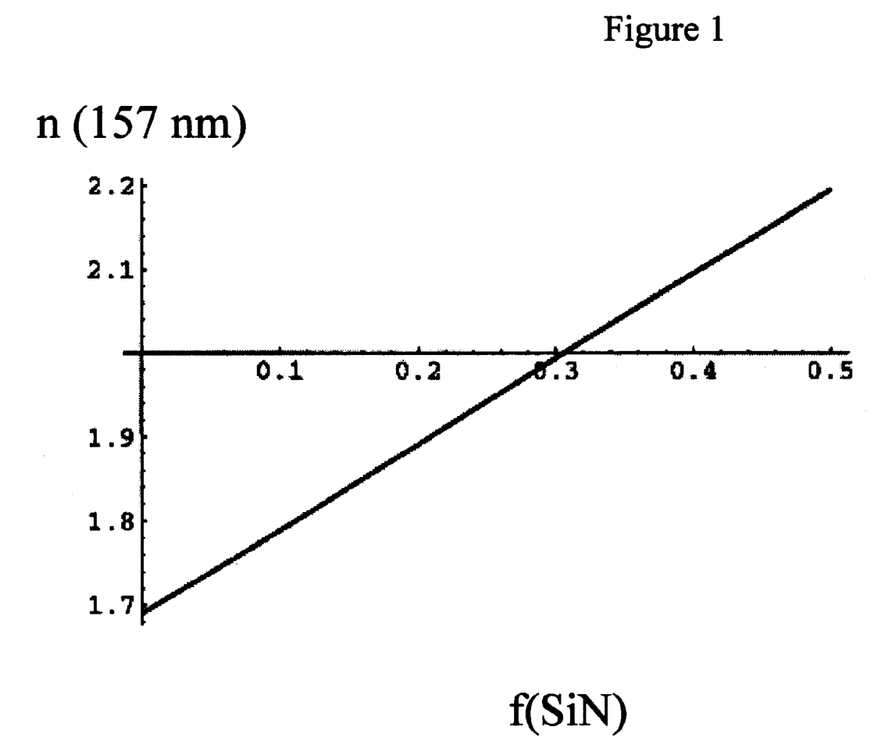
FIG. 1 is a graph showing the dependence of the index of refraction (n) at 157 nm on the fraction (f) of $Si_3N_4$ in $SiO_2/Si_3N_4$ multilayers.
Figure 2:
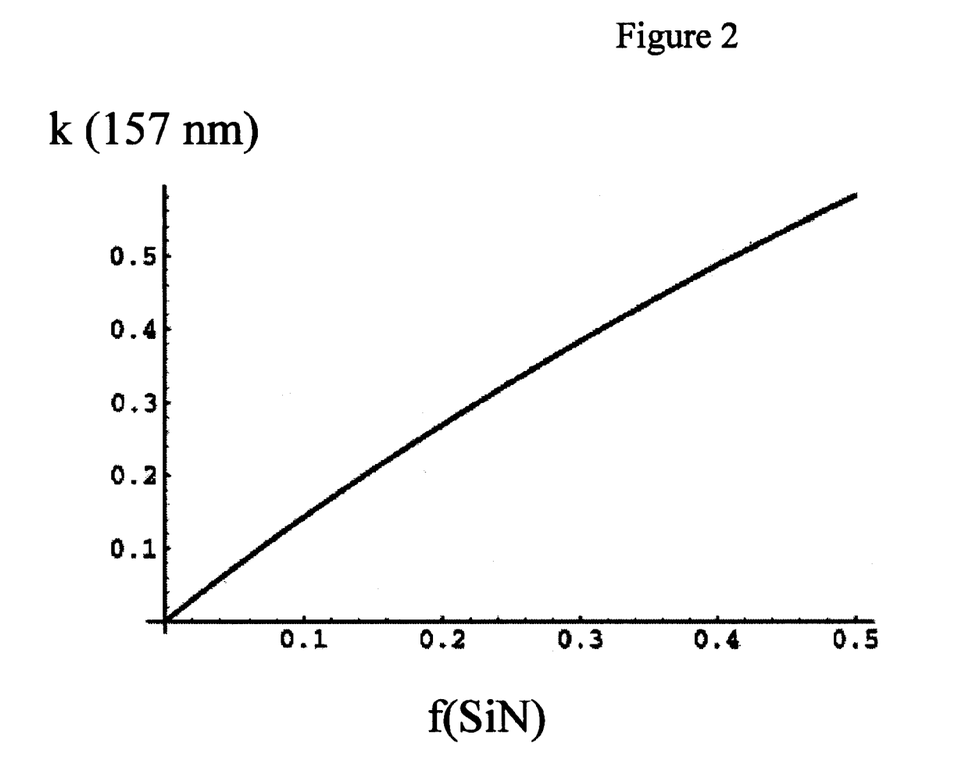
FIG. 2 is a graph showing the dependence of the extinction coefficient (k) at 157 nm on the fraction (f) of $Si_3N_4$ in $SiO_2/Si_3N_4$ multilayers.

At about 157 nm, the index of refraction and extinction coefficients for $SiO_2$ are n=1.69 and k=$1\times1^{-5}$, respectively; for $Si_3N_4$ n=2.65 and k=0.962 (Handbook of Optical Constants of Solids, ed. E. Palik, Academic Press, Orlando, 1985, pp. 719–763). Using Equations 3 and 4, the optical coefficients for the Si-oxide/Si-nitride multilayer can be calculated as a function of the fractional nitride thickness. These dependence of the optical coefficients for Si-oxide/Si-nitride multilayers is shown in FIGS. 1 and 2.

Figure 3:
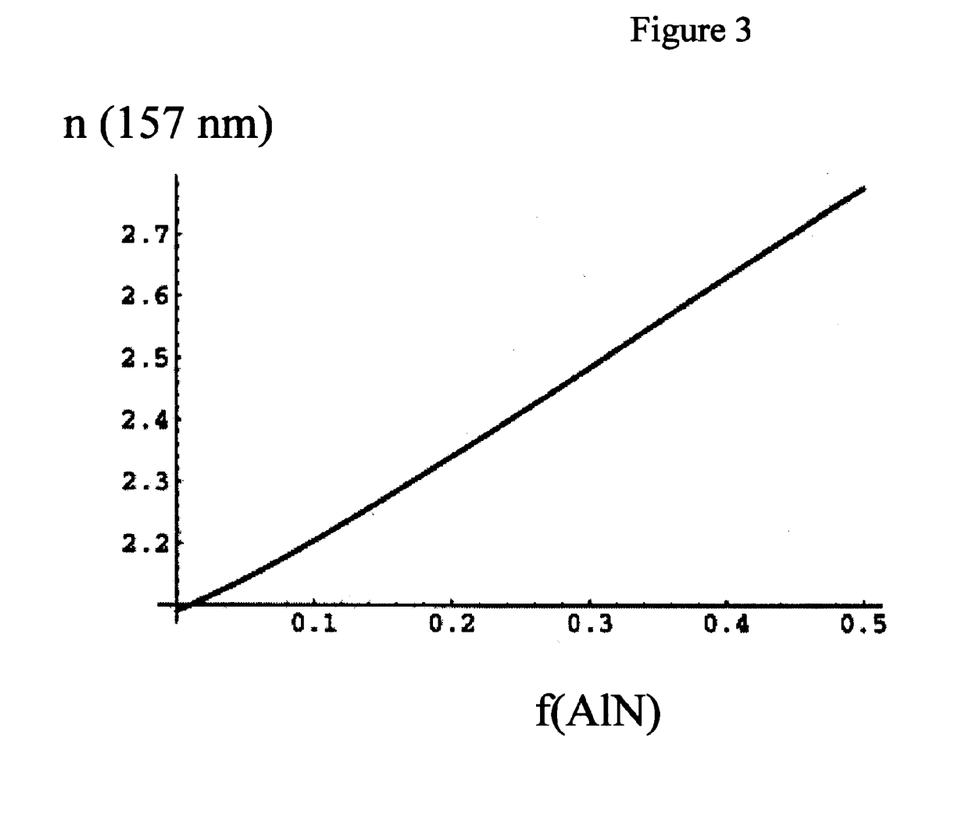
FIG. 3 is a graph showing the dependence of the index of refraction (n) at 157 nm on the fraction (f) of AlN in $Al_2O_3$/AlN multilayers.
Figure 4:
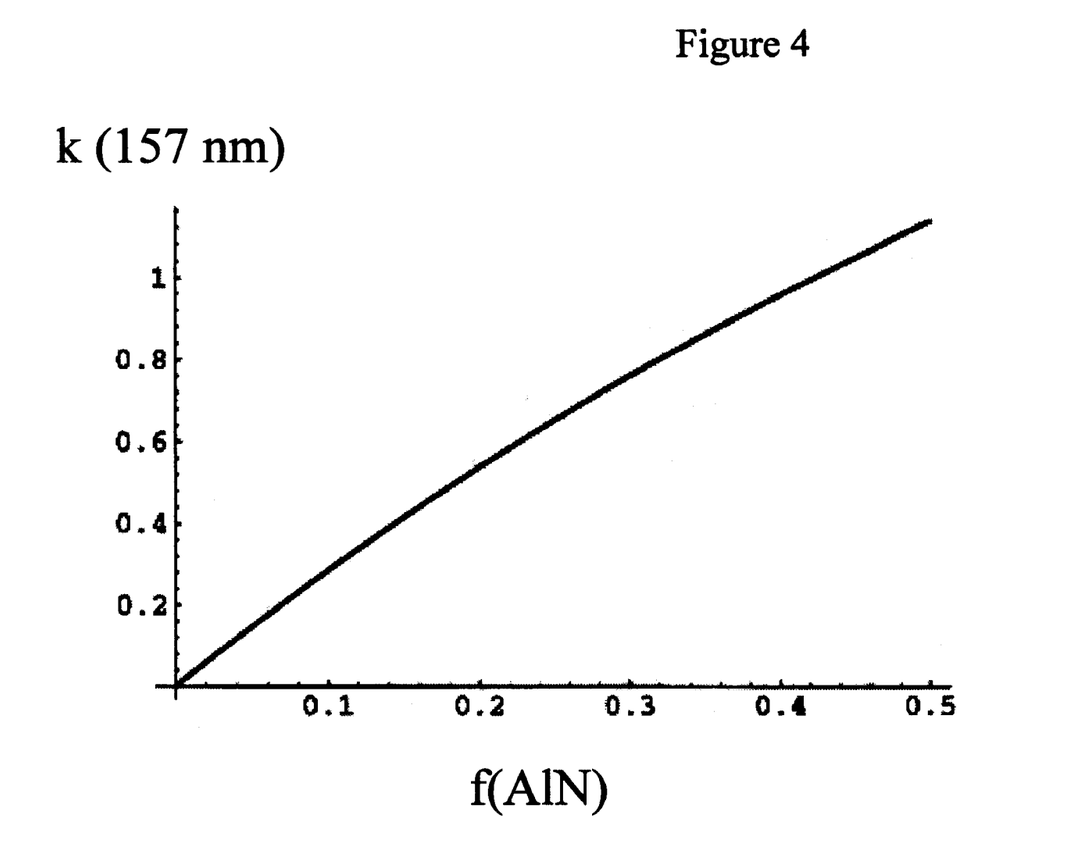
FIG. 4 is a graph showing the dependence of the extinction coefficient (k) at 157 nm on the fraction (f) of AlN in $Al_2O_3$/AlN multilayers.

For $Al_2O_3$ with n=2.09 and k=0 at about 157 nm (Handbook of Optical Constants of Solids II, ed. E. Palik, Acadernic Press, San Diego, 1991, pp. 719–763) and for AlN with k=3.02 and k=0.81 at the same wavelength (Handbook of Optical Constants of Solids III, ed. E. Palik, Academic Press, San Diego, 1998, pp. 373–401), the dependence of the optical coefficients of Al-oxide/Al-nitride multilayers is shown in FIGS. 3 and 4.

Figure 5:
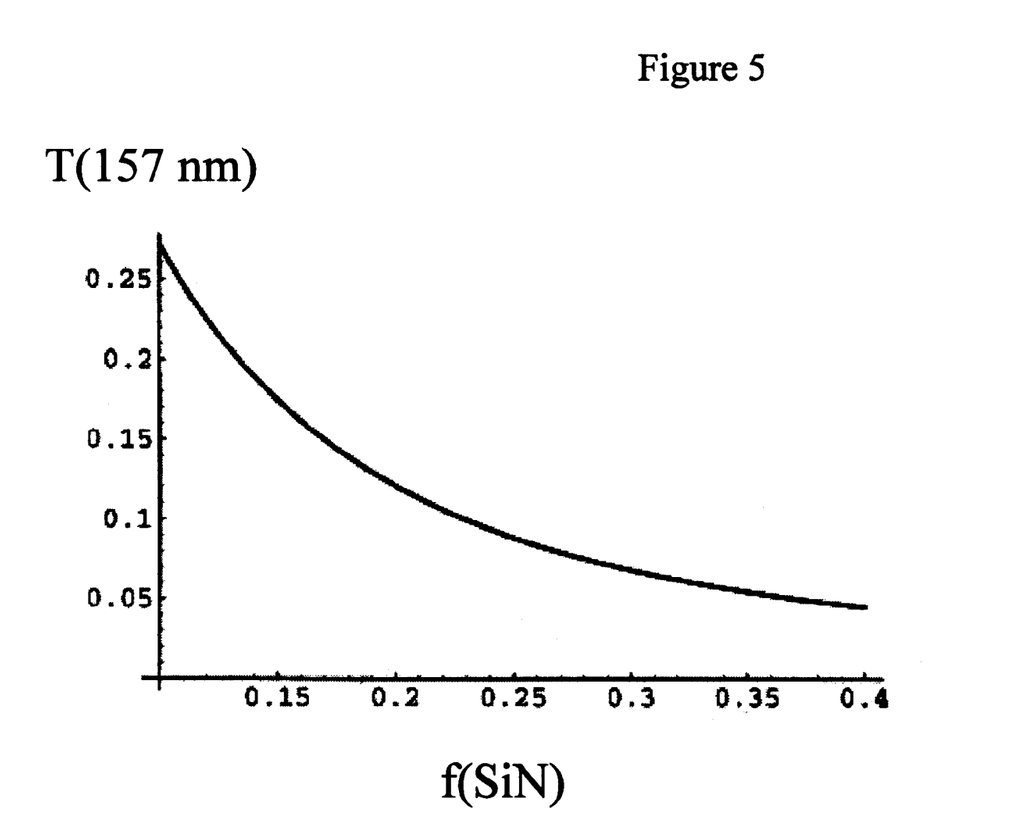
FIG. 5 is a graph showing the dependence of the optical transmission (T) for $SiO_2/Si_3N_4$ multilayers with 180° phase-shift on the fraction (f) of $Si_3N_4$.
Figure 6:
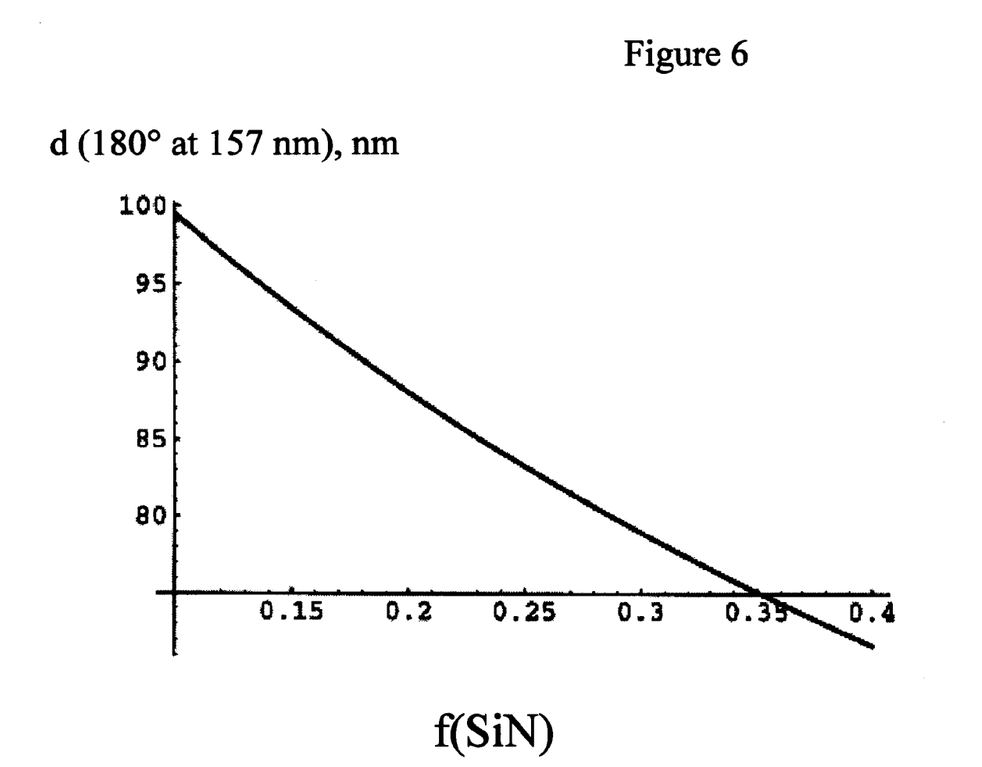
FIG. 6 is a graph showing the dependence of the total film thickness (d) for $SiO_2/Si_3N_4$ multilayers with 180° phase-shift on the fraction (f) of $Si_3N_4$.

From the dependence of the optical coefficients on the fractional nitride thickness, design graphs of the optical trans mission and the corresponding multilayer thickness with 180 degrees phase-shift can determined, using Equations 1 and 2, for both Si-oxide/Si-nitride and Al-oxide/Al-nitride multilayers versus the fractional nitride thickness. These graphs are shown in FIGS. 5 and 6 for Si-oxide/Si-nitride multilayers and in FIGS. 7 and 8 for Al-oxide/Al-nitride multilayers. FIGS. 5 and 6 indicate that to design an attenuating phase-shift mask with 180 degrees phase-shift and optical transmission between 5% and 15% requires fractional Si-nitride thicknesses of between about 0.37 and 0.17, respectively, corresponding to multilayer film thicknesses in the range of about 74 nm to 91 nm. Al-oxide/Al-nitride multilayers with 180 degrees phase-shift and optical transmisson between about 5% and 15% require fractional Al-nitride thicknesses of about 0.2 to 0.1, and multilayer thicknesses corresponding to about 58 nm to 65 nm. In the next section, FIGS. 5 and 6 for Si-oxide/Si-nitride and FIGS. 7 and 8 for Al-oxide/Al-nitride will be used to develop specific examples of multilayer designs for attenuating phase-shift masks.

EXAMPLES

Example 1

Si-oxide/Si-nitride multilayer phase-shift mask with T=15% at 157 nm

From FIGS. 5 and 6, T=15% requires a fractional Si-nitride thickness of 0.169, and 180 degrees phase-shift corresponds to a multilayer thickness of 91.3 nm at this fractional nitride thickness. If we choose a multilayer structure which is periodic with a periodicity of 7.6 nm, much less than the optical wavelength of 157 nm, then the multilayer structure will consist of 12 layers of Si-nitride, each 1.284 nm thick alternating with 12 layers of Si-oxide, each 6.316 nm thick. This can be expressed as:

$$12\times(1.284 \text{ nm } Si_3N_4 + 6.316 \text{ nm } SiO_2)$$

Example 2

Si-oxide/Si-nitride multilayer phase-shift mask with T=10% at 157 nm

From FIGS. 5 and 6, T=10% requires a fractional Si-nitride thickness of 0.230, and 180 degrees phase-shift corresponds to a multilayer thickness of 85 nm at this fractional nitride thickness. If we choose a multilayer structure which is periodic with a periodicity of 8.5 nm, much less than the optical wavelength of 157 nm, then the multilayer structure will consist of 10 layers of Si-nitride, each 1.96 nm thick alternating with 10 layers of Si-oxide, each 6.54 nm thick. This can be expressed as:

$$10\times(1.96 \text{ nm } Si_3N_4 + 6.54 \text{ nm } SiO_2)$$

Example 3

Si-oxide/Si-nitride multilayer phase-shift mask with T=5% at 157 nm

From FIGS. 5 and 6, T=5% requires a fractional Si-nitride thickness of 0.37, and 180 degrees phase-shift corresponds to a multilayer thickness of 73.7 nm at this fractional nitride thickness. If we choose a multilayer structure which is periodic with a periodicity of 6.7 nm, much less than the optical wavelength of 157 nm, then the multilayer structure will consist of 11 layers of Si-nitride, each 2.48 nm thick alternating with 11 layers of Si-oxide, each 4.22 nm thick. This can be expressed as:

$$11\times(2.48 \text{ nm } Si_3N_4 + 4.22 \text{ nm } SiO_2)$$

Example 4

Al-oxide/Al-nitride multilayer phase-shift mask with T=15.3% at 157 nm

Figure 7:
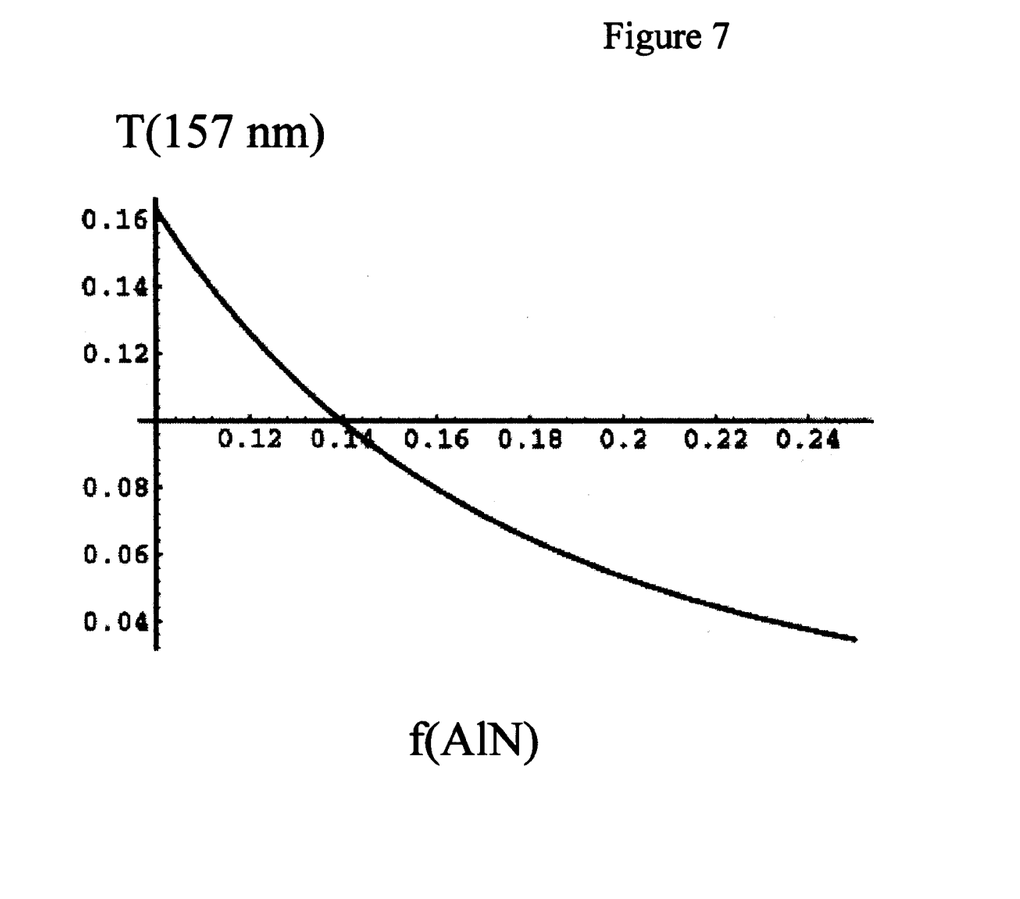
FIG. 7 is a graph showing the dependence of the optical transmission (T) for $Al_2O_3$/AlN multilayers with 180° phase-shift on the fraction (f) of AlN.
Figure 8:
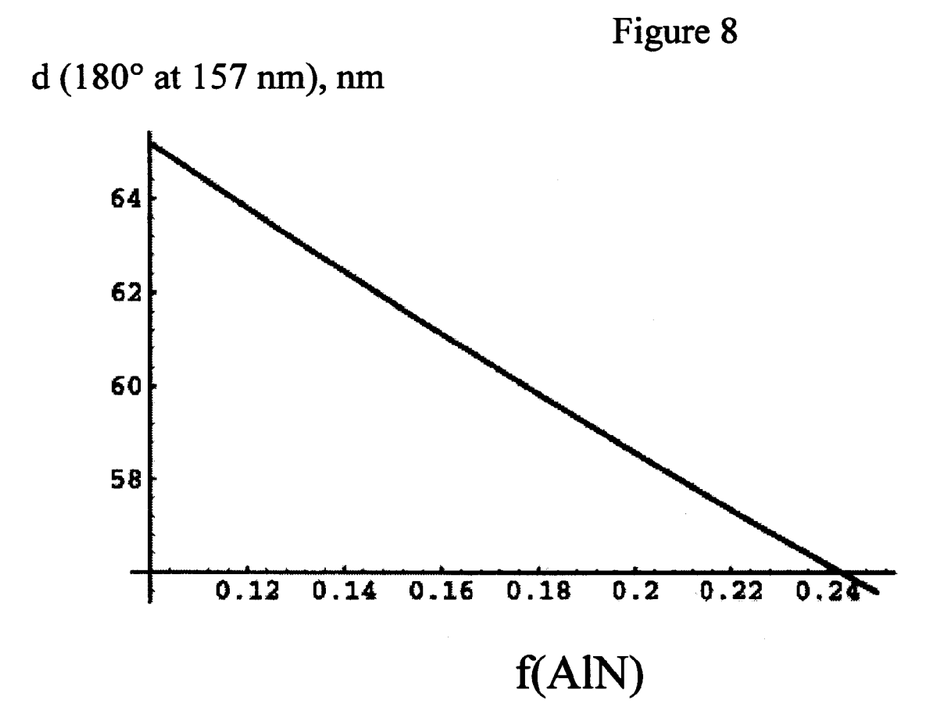
FIG. 8 is a graph showing the dependence of the total film thickness (d) for $Al_2O_3$/AlN multilayers with 180° phase-shift on the fraction (f) of AlN.

From FIGS. 7 and 8, T=15.3% requires a fractional Al-nitride thickness of 0.105, and 180 degrees phase-shift corresponds to a multilayer thickness of 64.8 nm at this fractional nitride thickness. If we choose a multilayer structure which is periodic with a periodicity of 7.2 nm, much less than the optical wavelength of 157 nm, then the multilayer structure will consist of 9 layers of Al-nitride, each 0.76 nm thick alternating with 9 layers of Al-oxide, each 6.44 nm thick. This can be expressed as:

$$9\times(0.76\text{ nm AlN}+4.22\text{ nm Al}_2\text{O}_3)$$

Example 5

Al-oxide/Al-nitride multilayer phase-shift mask with T=10.4% at 157 nm

From FIGS. 7 and 8, T=10.4% requires a fractional Al-nitride thickness of 0.136, and 180 degrees phase-shift corresponds to a multilayer thickness of 62.7 nm at this fractional nitride thickness. If we choose a multilayer structure which is periodic with a periodicity of 5.7 nm, much less than the optical wavelength of 157 nm, then the multilayer structure will consist of 11 layers of Al-nitride, each 0.775 nm thick alternating with 11 layers of Al-oxide, each 4.925 nm thick. This can be expressed as:

$$11\times(0.775\text{ nm AlN}+4.925\text{ tn Al}_2\text{O}_3)$$

Example 6

Al-oxide/Al-nitride multilayer phase-shift mask with T=5.3% at 157 nm

From FIGS. 7 and 8, T=5.3% requires a fractional Al-nitride thickness of 0.20, and 180 degrees phase-shift corresponds to a multilayer thickness of 58.6 nm at this fractional nitride thickness. If we choose a multilayer structure which is periodic with a periodicity of 5.86 nm, much less than the optical wavelength of 157 nm, then the multilayer structure will consist of 10 layers of Al-nitride, each 1.17 nm thick alternating with 10 layers of Al-oxide, each 4.69 nm thick. This can be expressed as:

$$10\times(1.17\text{ nm AlN}+4.69\text{ nm Al}_2\text{O}_3)$$

What is claimed is:

1. An attenuating embedded phase shift mask, capable of producing a phase shift of 180° with an optical transmissivity of at least 0.001 at a selected lithographic wavelength <200 nm, said mask comprising:

distinct alternating contiguous layers of an optically transparent material consisting essentially of an oxide selected from the group consisting of oxides of Al and Si and layers of an optically absorbing material consisting essentially of a nitride selected from the group consisting of nitrides of Al and Si.

2. The mask of claim 1 wherein the optically transparent material consists essentially of an oxide Si and the optically absorbing material consists essentially of a nitride of Si.

3. The mask of claim 1 wherein the optically transparent material consists essentially of an oxide of Al and the optically absorbing material consists essentially of a nitride of Al.

* * * * *